(12) United States Patent
Lin et al.

(10) Patent No.: US 11,401,608 B2
(45) Date of Patent: Aug. 2, 2022

(54) ATOMIC LAYER DEPOSITION EQUIPMENT AND PROCESS METHOD

(71) Applicant: SKY TECH INC., Hsinchu County (TW)

(72) Inventors: Jing-Cheng Lin, Hsinchu County (TW); Ching-Liang Yi, Hsinchu County (TW); Yun-Chi Hsu, Hsinchu County (TW); Hsin-Yu Yao, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/075,684

(22) Filed: Oct. 20, 2020

(65) Prior Publication Data
US 2022/0119946 A1    Apr. 21, 2022

(51) Int. Cl.
| | | |
|---|---|---|
| *C23C 16/455* | (2006.01) | |
| *C23C 16/458* | (2006.01) | |
| *C23C 16/44* | (2006.01) | |
| *H01L 21/02* | (2006.01) | |

(52) U.S. Cl.
CPC .... *C23C 16/45544* (2013.01); *C23C 16/4412* (2013.01); *C23C 16/4585* (2013.01); *C23C 16/45502* (2013.01); *C23C 16/45527* (2013.01); *H01L 21/0228* (2013.01)

(58) Field of Classification Search
CPC .......... C23C 16/45544; C23C 16/4412; C23C 16/45502; C23C 16/4585; C23C 16/45527; H01L 21/0228
See application file for complete search history.

(56) References Cited

U.S. PATENT DOCUMENTS

| | | | | |
|---|---|---|---|---|
| 5,755,886 A | * | 5/1998 | Wang | C23C 16/45565 |
| | | | | 118/725 |
| 5,846,332 A | * | 12/1998 | Zhao | C23C 16/46 |
| | | | | 118/500 |
| 7,001,491 B2 | * | 2/2006 | Lombardi | C23C 14/564 |
| | | | | 204/192.12 |
| 8,512,511 B2 | * | 8/2013 | Himori | H01L 21/6833 |
| | | | | 156/345.43 |
| 10,062,585 B2 | * | 8/2018 | Lubomirsky | H01J 37/32715 |
| 2007/0131167 A1 | * | 6/2007 | Kodashima | H01L 21/6719 |
| | | | | 156/345.1 |

(Continued)

FOREIGN PATENT DOCUMENTS

| | | | | |
|---|---|---|---|---|
| CN | 101005029 A | * | 7/2007 | C23C 16/36 |
| CN | 101370963 A | * | 2/2009 | C23C 16/45536 |

(Continued)

*Primary Examiner* — Jeffrie R Lund
(74) *Attorney, Agent, or Firm* — Chun-Ming Shih; HDLS IPR Services

(57) ABSTRACT

An atomic layer deposition equipment and an atomic layer deposition process method are disclosed. The atomic layer deposition equipment includes a chamber, a substrate stage, at least one bottom pumping port, at least one hollow component, a baffle and a shower head assembly, wherein the hollow component has an exhaust hole. The baffle is below the hollow component and forms an upper exhaust path with the hollow component, so that the flow field of the precursor in the atomic layer deposition process can be adjusted to a slow flow field to make a uniform deposition on the substrate.

17 Claims, 5 Drawing Sheets

(56) References Cited

U.S. PATENT DOCUMENTS

| | | | | |
|---|---|---|---|---|
| 2007/0215284 A1* | 9/2007 | Oyabu | .............. | H01J 37/32009 |
| | | | | 118/728 |
| 2012/0247678 A1* | 10/2012 | Takahashi | ........... | H01L 21/6831 |
| | | | | 156/345.44 |
| 2012/0251737 A1* | 10/2012 | Osaki | .................. | H01L 21/3105 |
| | | | | 427/575 |
| 2015/0027637 A1* | 1/2015 | Haga | ................. | H01J 37/32568 |
| | | | | 156/345.28 |
| 2016/0126063 A1* | 5/2016 | Yamawaku | ....... | H01J 37/32183 |
| | | | | 315/111.21 |
| 2017/0207099 A1* | 7/2017 | Ohtake | ............. | H01J 37/32183 |
| 2018/0138018 A1* | 5/2018 | Voronin | ............ | H01J 37/32302 |
| 2018/0202046 A1* | 7/2018 | Savas | .................... | C23C 16/401 |
| 2020/0152432 A1* | 5/2020 | Kon | .................... | H01L 21/6831 |
| 2021/0027994 A1* | 1/2021 | Motegi | ............. | H01L 21/67742 |
| 2022/0119945 A1* | 4/2022 | Lin | ................... | C23C 16/45544 |
| 2022/0119946 A1* | 4/2022 | Lin | ..................... | C23C 16/4585 |

FOREIGN PATENT DOCUMENTS

| | | | | |
|---|---|---|---|---|
| CN | 108885991 A | * | 11/2018 | ............. C09K 13/00 |
| CN | 112609170 A | * | 4/2021 | ....... C23C 16/45502 |
| JP | 2001274151 A | * | 10/2001 | ......... C23C 16/4408 |
| JP | 2007005491 A | * | 1/2007 | ................. C23F 4/00 |
| JP | 4129855 B2 | * | 8/2008 | ........ H01J 37/32082 |
| JP | 2009088473 A | * | 4/2009 | ........... C23C 16/409 |
| KR | 101675817 B1 | * | 11/2016 | ......... H01L 21/0228 |
| TW | 202106917 A | * | 2/2021 | ......... C23C 16/4408 |
| WO | WO-9949102 A1 | * | 9/1999 | ......... C23C 16/4401 |
| WO | WO-03028083 A1 | * | 4/2003 | ........... C03B 29/025 |

\* cited by examiner

ATOMIC LAYER DEPOSITION EQUIPMENT AND PROCESS METHOD

TECHNICAL FIELD

This present disclosure relates to an atomic layer deposition equipment and an atomic layer deposition process method, more particularly, to an atomic layer deposition equipment and an atomic layer deposition process method that regulate the flow field of the process fluid through an upper exhaust path which is formed between a hollow component and a baffle.

BACKGROUND

The integrated circuit (IC) technology has matured, and the current development trend is to make electronic products more lightweight, high-performance, high-reliability and intelligent. The technology to miniaturize transistors of electronic products is very important. The size of the transistor is related to the performance of the electronic product. In electronic products, smaller transistors can reduce current transmission time and reduce energy consumption, so as to quickly calculate and achieve energy-saving effects. At present, in the tiny transistors, some of the key thin film layers are almost only a few atoms thick, and one of the techniques to develop these microstructures is the atomic layer deposition process (ALD process).

The ALD process allows the substance to be deposited layer by layer on the surface of the substrate in the form of single atoms. More specifically, the process allows the precursor to be chemically adsorbed on the surface of the substrate or the material surface of the previous film, thereby producing a uniform and thin film. In the ALD process, depositing uniform thin films is an important foundation of transistor scaling. Therefore, an important issue in the development of transistors is how to effectively control the uniformity of the thin film.

At present, in the ALD process, it is still hard to effectively control the uniformity of the deposited film. One of the problems is that the flow field of the precursor is not properly controlled (for example, how to pump the precursor out of the chamber without affecting the uniformity of the substrate in the deposition process). Most ALD equipment has a large closed chamber. During the ALD process, the chamber can contain a large number of precursors, and the precursors are retained in the chamber to contact the substrate for deposition. The closed chamber can avoid the loss of precursors before the deposition is completed. When the deposition is complete, the precursors in the chamber are exhausted through the pumping port at the bottom of the chamber.

However, in the ALD process, if such a large closed chamber is used, the amount of precursors will be large, resulting in excessive costs. Furthermore, if the time to pump out the precursors is not well controlled, when the precursors are pumped out through a single pumping device (bottom pumping port), the precursors may not flow steadily, resulting in poor uniformity of the deposited substrate.

In order to reduce costs, one of the methods is to reduce the volume of the chamber to reduce the amount of precursors. However, this method will cause the precursors to form a turbulent flow, causing the precursors to repeatedly contact the substrate and reduce the uniformity of the substrate. Therefore, how to reduce the cost and control the uniformity of the precursor deposition on the substrate are issues to be overcome in the current ALD process.

SUMMARY

Therefore, to overcome the deficiencies in the conventional technology, an object of the present disclosure is to provide an atomic layer deposition equipment and an atomic layer deposition process method, which can control a precursor and/or purge gas to form a slow flow field, so as to adjust the uniformity of a substrate when the precursor is deposited on the substrate. The atomic layer deposition equipment includes a chamber, a substrate stage, at least one bottom pumping port, at least one hollow component, a baffle, and a shower head assembly, wherein the bottom pumping port is fluidly connected to the chamber, and the baffle is disposed under the hollow component. In the atomic layer deposition process, the shower head assembly provides precursors into the chamber, so that the precursors are deposited on the substrate carried by the substrate stage, wherein the baffle and the hollow component can form an upper exhaust path to make the precursor form a controlled slow flow field. In this way, the deposition behavior of the precursor and the flow behavior of the precursor being pumped out of the chamber can be controlled, so that the atomic layer deposition process can be optimized.

In an atomic layer deposition process, there are 5 steps in depositing the precursor on the substrate. After the substrate is placed on the substrate stage, a fluid is pumped out from the chamber through the bottom pumping port. Next, the precursor is introduced into the chamber to react with the substrate. When the precursor reaches a predetermined amount, the introduction of the precursor into the chamber is stopped. Further, introduce the purge gas into the chamber, and pump out the precursor from the chamber through the upper exhaust path formed between the hollow component and the baffle. Finally, stop introducing the purge gas into the chamber and stop pumping out the precursor through the upper exhaust path. Through the above steps, the process of providing a first precursor in the atomic layer deposition process can be realized. Similarly, the process of providing a second precursor is the same as the above. The process of each atomic layer deposition can also repeat the above steps to achieve a complete atomic layer deposition process.

In an atomic layer deposition process, the process of depositing precursors can also be described as follows. First, pump out a fluid from the chamber through the bottom pumping port, and pump out the fluid from the chamber through the upper exhaust path formed between the hollow component and the baffle. Then, the precursor is introduced into the chamber to react with the substrate. When the precursor reaches a predetermined amount, stop introducing the precursor into the chamber. Further, introduce the purge gas into the chamber, and keep pumping out the precursor through the upper exhaust path.

It is then an object of the present disclosure to provide an atomic layer deposition equipment. The atomic layer deposition equipment includes a chamber, a substrate stage, at least one bottom pumping port, at least one hollow component, a baffle and a shower head assembly. The chamber includes a containing space. The substrate stage is disposed in the containing space of the chamber and is used to support at least one substrate. The bottom pumping port is fluidly connected to the containing space of the chamber and is connected to a pump, and is used to exhaust at least one fluid in the containing space. The hollow component includes at least one exhaust hole and is fluidly connected to the containing space of the chamber, wherein the hollow component is disposed next to the substrate stage. The baffle is disposed below the hollow component and forms an upper exhaust path with the hollow component. The shower head assembly is fluidly connected to the containing space of the chamber, and is used to provide at least one precursor or a purge gas into the chamber.

It is another object of the present disclosure to provide an atomic layer deposition process method. The atomic layer deposition process method includes: pumping out a fluid from the containing space of the chamber through the bottom pumping port; providing a precursor to the containing space of the chamber for the precursor to react with the substrate on the substrate stage; stopping providing the precursor to the containing space of the chamber; providing a purge gas to the containing space of the chamber, and pumping out the precursor from the containing space of the chamber through the upper exhaust path formed between the hollow component and the baffle; and stopping providing the purge gas to the containing space of the chamber, and stopping pumping out the precursor from the containing space of the chamber through the upper exhaust path.

It is yet another object of the present disclosure to provide an atomic layer deposition process method. The atomic layer deposition process method includes: pumping out a fluid from the containing space of the chamber through the bottom pumping port, and pumping out the fluid from the containing space of the chamber through the upper exhaust path formed between the hollow component and the baffle, wherein pumping out the fluid from the containing space of the chamber through the upper exhaust path is continuous during the atomic layer deposition process; providing a precursor to the containing space of the chamber for the precursor to react with the substrate on the substrate stage; stopping providing the precursor to the containing space of the chamber; providing a purge gas to the containing space of the chamber; and stopping providing the purge gas to the containing space of the chamber, and continuing pumping out the precursor from the containing space of the chamber through the upper exhaust path.

Optionally, the position of the hollow component is higher than the substrate stage.

Optionally, the baffle further includes at least one horizontal extension portion and at least one vertical extension portion, the vertical extension portion is connected to the horizontal extension portion, and the horizontal extension portion is connected to the substrate stage.

Optionally, the exhaust hole is located at a bottom of the hollow component, and one end of the vertical extension portion corresponds to the exhaust hole of the hollow component.

Optionally, the exhaust hole is located at a side of the hollow component, and one end of the horizontal extension portion corresponds to the exhaust hole of the hollow component.

Optionally, the substrate stage has a substrate supporting portion and an outer portion, the substrate supporting portion is connected to the outer portion, wherein the cross-sectional area of the outer portion is larger than the cross-sectional area of the substrate supporting portion. There is a first vertical distance between the horizontal extension portion of the baffle and the bottom of the hollow component, and there is a second vertical distance between the horizontal extension portion and the outer portion of the substrate stage, wherein the second vertical distance is shorter than the first vertical distance.

Optionally, at least one of the hollow component and the baffle is movable relative to the other for adjusting the first vertical distance.

Optionally, the horizontal extension portion of the baffle is connected to an edge of the substrate stage.

Optionally, the horizontal extension portion of the baffle is connected to a top of the substrate stage, and the substrate stage holds the substrate through the baffle.

In short, the present disclosure provides an atomic layer deposition equipment and an atomic layer deposition process method which can form a slow flow field of the precursor by the hollow component and the baffle, thereby the precursor can be deposited on the substrate in a dynamic manner, and further regulate the uniformity of the substrate in the atomic layer deposition process. Furthermore, the baffle can cover a part of the substrate stage so that some precursors that are not deposited on the substrate can adhere to the baffle. In this way, during the maintenance of the atomic layer deposition equipment, the baffle can be directly replaced without replacing the substrate stage, so the cost can be saved, and therefore it has competitive advantage in the market that requires ALD process (such as IC industry).

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

According to embodiments of the present disclosure, an atomic layer deposition equipment and a process method using the same are provided. The atomic layer deposition equipment not only has a bottom pumping port connected to a chamber, but also has a hollow component that is used to form an upper exhaust path with a baffle, wherein the upper exhaust path can cause the excess precursor to be pumped out of the chamber. Thus, the atomic layer deposition equipment of the present disclosure is different from the deposition equipment of the prior art which only removes the excess precursor through the bottom pumping port. Furthermore, the distance between the hollow component and the baffle can be adjusted, and by controlling the process parameters (for example, the time for supplying precursors or purge gas, or the time for pumping), the deposition of precursors to be reacted with the substrate can be further controlled to optimize the uniformity of the substrate.

Figure 1A:
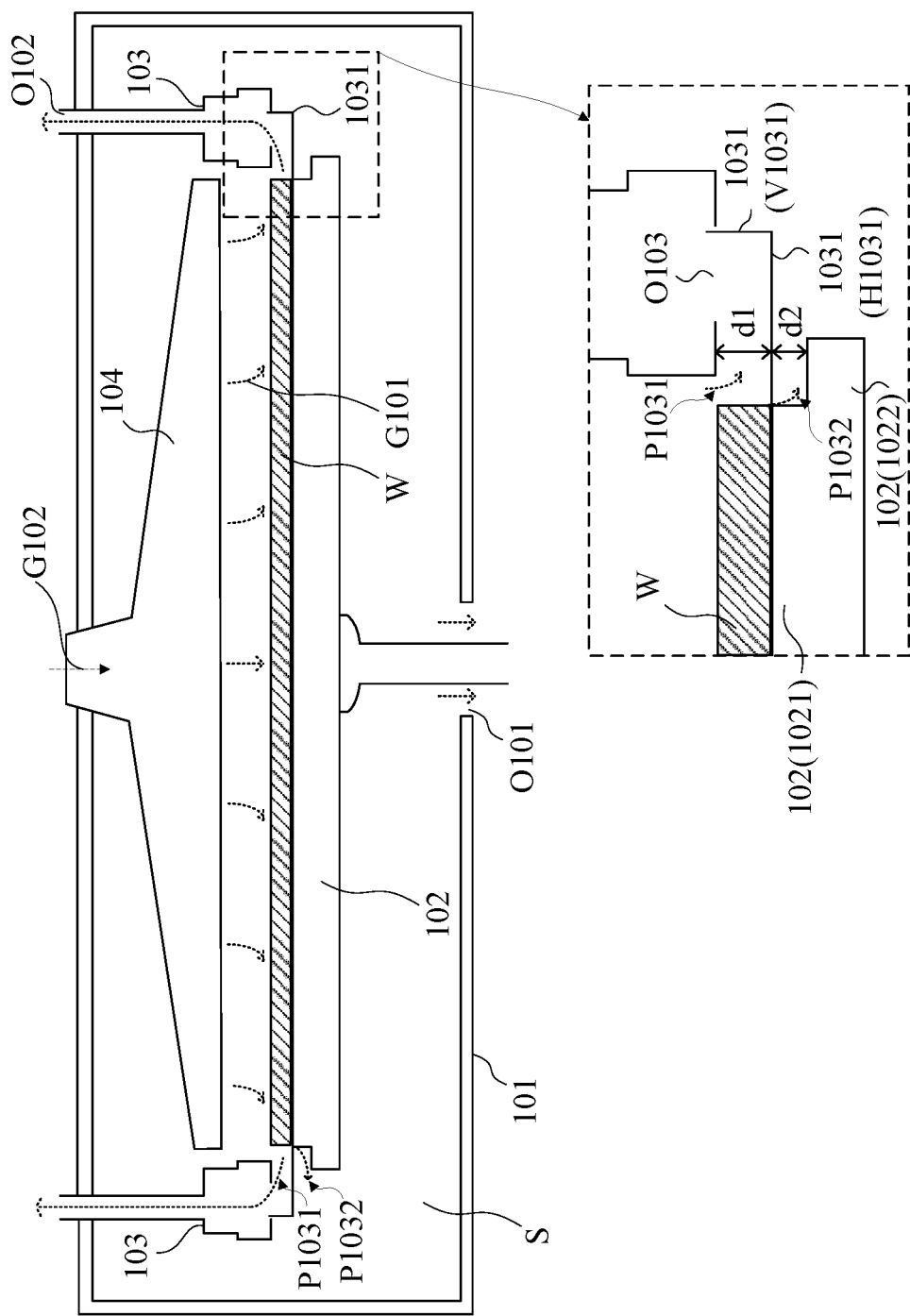
FIG. 1A is a schematic view of an atomic layer deposition equipment according to an embodiment of the present disclosure.
Figure 1C:
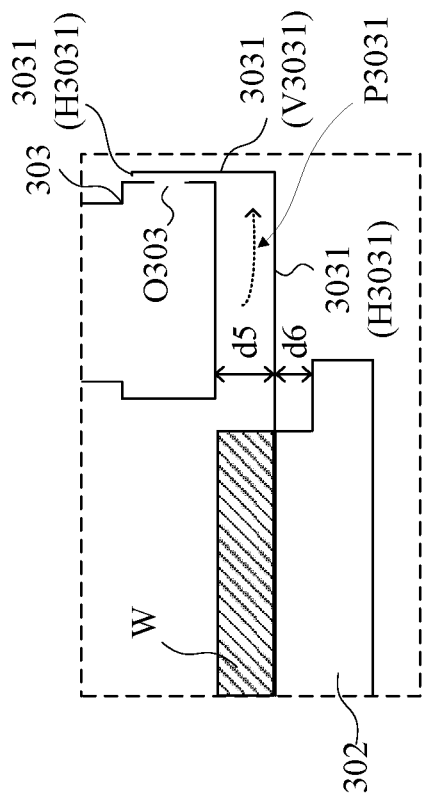
FIG. 1C is a schematic view illustrating a part of an atomic layer deposition equipment according to yet another embodiment of the present disclosure.
Figure 1B:
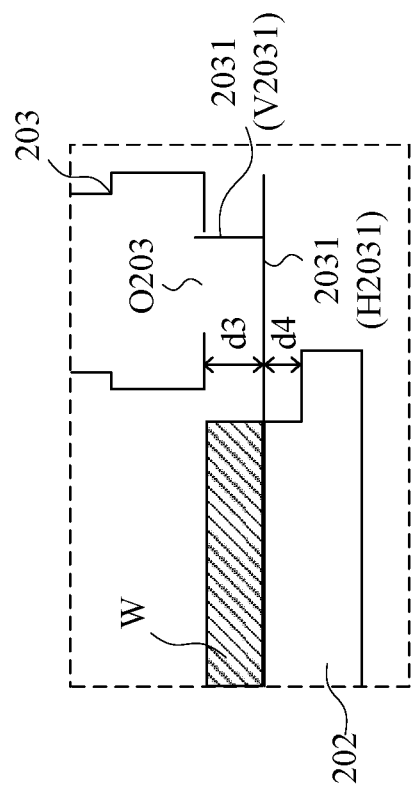
FIG. 1B is a schematic view illustrating a part of an atomic layer deposition equipment according to another embodiment of the present disclosure.

FIG. 1A is a schematic view of an atomic layer deposition equipment according to an embodiment of the present disclosure. FIG. 1B is a schematic view of a part of an atomic layer deposition equipment according to another embodiment of the present disclosure. FIG. 1C is a schematic view of a part of an atomic layer deposition equipment according to yet another embodiment of the present disclosure. Referring to FIGS. 1A, 1B and 1C, the atomic layer deposition equipment 1 has a chamber 101, at least one bottom pumping port O101, a substrate stage 102, a baffle 1031, 2031, 3031, multiple hollow components 103, and a shower head assembly 104. The chamber 101 has a containing space S, and the bottom pumping port O101 is fluidly connected to the containing space S of the chamber 101, wherein the bottom pumping port O101 can connect to a power device (for example, a pump) to form a bottom pumping device to pump out at least one fluid in the containing space S. The substrate stage 102 is disposed in the containing space S of the chamber 101, and is used to support a substrate W (for example, but not limited to a wafer). The hollow component 103 is fluidly connected to the containing space S of the chamber 101 and is disposed next to the substrate stage 102. The baffle 1031, 2031, 3031 is disposed below the hollow component 103 and forms an upper exhaust path P1031 with the hollow component 103. The shower head assembly 104 is fluidly connected to the containing space S of the chamber 101, and is used to provide a precursor or purge gas into the chamber 101.

Specifically, the substrate stage 102 is connected to the baffle 1031, 2031, 3031, and the baffle 1031, 2031, 3031 has at least one horizontal extension portion H1031, H2031, H3031 and at least one vertical extension portion V1031, V2031, V3031, wherein the vertical extension portion V1031, V2031, V3031 is connected to the horizontal extension portion H1031, H2031, H3031, and the horizontal extension portion H1031, H2031, H3031 is connected to the substrate stage 102. The horizontal extension portion H1031, H2031, H3031 of the baffle 1031, 2031, 3031 can connect to the edge of the substrate stage 102, or the horizontal extension portion H1031, H2031, H3031 of the baffle 1031, 2031, 3031 can connect to the top of the substrate stage 102, so that the substrate stage 102 holds the substrate W through the baffle 1031, 2031, 3031.

Figure 1D:
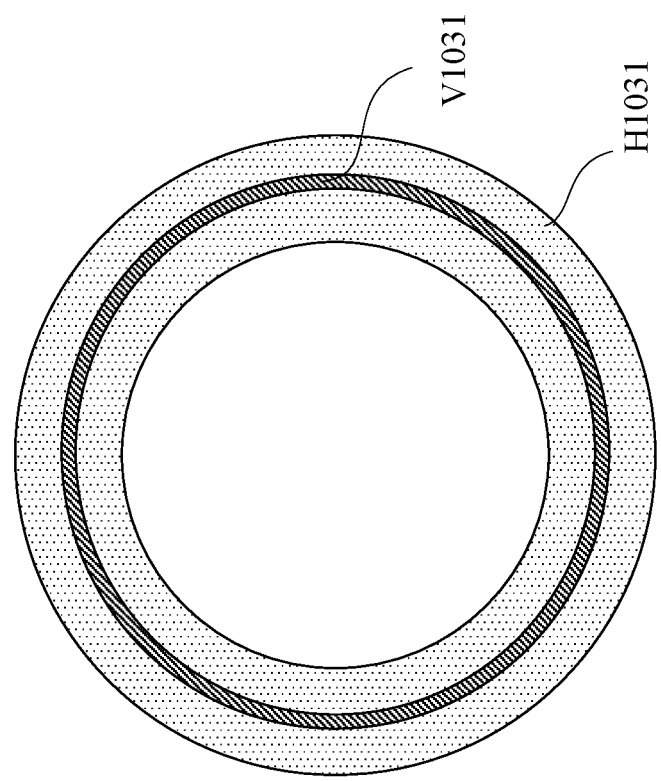
FIG. 1D is a top view of a baffle according to an embodiment of the present disclosure.

FIG. 1D is a top view of a baffle according to an embodiment of the present disclosure. Referring to FIG. 1D, the baffle 1031 is a circular ring and has the horizontal extension portion H1031 and the vertical extension portion V1031, wherein the baffle 1031 is not limited to be integrally formed or composed of multiple components.

Referring to FIGS. 1A to 1C, there are no limitations on the shape and the appearance of the substrate stage 102. For example, the substrate stage 102 has a substrate supporting portion 1021 and an outer portion 1022, wherein the substrate supporting portion 1021 is connected to the outer portion 1022. Specifically, the outer portion 1022 is disposed next to the substrate supporting portion 1021, and the substrate supporting portion 1021 is higher than the outer portion 1022, wherein the cross-sectional area of the outer portion 1022 is larger than the cross-sectional area of the substrate supporting portion 1021, according to FIG. 1A. In one embodiment, the substrate supporting portion 1021 of the substrate stage 102 is connected to the horizontal extension portion H1031 of the baffle 1031.

Referring to FIGS. 1A to 1C, each of the hollow components 103, 203, 303 has at least one exhaust hole O103, O203, O303, a top opening O102, and a hollow section penetrating the exhaust hole O103, O203, O303 and the top opening O102, wherein the hollow section can be connected to the outside. There are no limitations on the hollow path of the hollow section, and there are no limitations on the location of the exhaust hole. For example, the exhaust hole O103, O203 is located at the bottom of the hollow component 103, 203, according to FIGS. 1A, 1B, whereas the exhaust hole O303 is located at the side of the hollow component 303, according to FIG. 1C. There are no limitations on the amount of hollow components. The exhaust hole O103, O203, O303 can be arranged corresponding to the baffle 1031, 2031, 3031. Specifically, when the exhaust hole O103, O203 is located at the bottom of the hollow component 103, 203, one end of the vertical extension portion V1031, V2031 corresponds to the exhaust hole O103, O203 of the hollow component 103, 203, and when the exhaust hole O303 is located at the side of the hollow component 303, one end of the horizontal extension portion H3031 corresponds to the exhaust hole O303 of the hollow component 303.

There is a first vertical distance d1, d3, d5 between the horizontal extension portion H1031, H2031, H3031 of the baffle 1031, 2031, 3031 and the bottom of the hollow component 103, 203, 303 and the first vertical distance d1, d3, d5 is adjustable (for example, move the substrate stage 102, 202, 302 vertically to drive the baffle 1031, 2031, 3031 towards or away from the hollow component 103, 203, 303, or move the hollow component 103, 203, 303 vertically towards or away from the baffle 1031, 2031, 3031), wherein the first vertical distance d1, d3, d5 can be adjusted to, for example but not limited to, 1-10 mm. There are no limitations on the shape and the appearance of the hollow component 103, 203, 303 and the baffle 1031, 2031, 3031. For example, the hollow component can be an irregular shape, and the cut surface of the baffle 1031, 2301, 3031 can be L-shaped (as shown in FIG. 1A), or inverted T-shaped (as shown in FIG. 1B) or other shapes. In one embodiment, the hollow component 103, 203, 303 can be located above the substrate stage 102, 202, 302. Specifically, a part of the bottom of the hollow component 103, 203, 303 can be correspondingly disposed above the substrate stage 102, 202, 302. For example, if the cross-sectional area of the outer portion 1022 of the substrate stage 102 is larger than the cross-sectional area of the substrate supporting portion 1021 of the substrate stage 102, a part of the bottom of the hollow component 103 is correspondingly disposed above the outer portion 1022 of the substrate stage 102. Furthermore, there is a second vertical distance d2, d4, d6 between the horizontal extension portion H1031, H2031, H3013 and the outer portion 1022 of the substrate stage 102, wherein the second vertical distance d2, d4, d6 is shorter than the first vertical distance d1, d3, d5.

Referring to FIGS. 1A to 1C, the hollow component 103, 203, 303 can connect to a power device (for example, a pump) through the top opening O102 to form an upper pumping device. When the upper pumping device works, an upper exhaust path P1031, P3031 is formed between the bottom of the hollow component 103, 203, 303 and the baffle 1031, 2031, 3031, and a lower exhaust path P1032 is formed between the substrate stage 102, 202, 302 and the baffle 1031, 2031, 3031, where there may be a pore between the substrate stage 102, 202, 302 and the baffle 1031, 2031, 3031, or the baffle 1031, 2031, 3031 may have tiny holes so that the lower exhaust path P1032 can be formed. The upper exhaust path P1031 and the lower exhaust path P1032 can make the fluid in the chamber 101 (for example, the precursor G101) present a slow flow field, and make the fluid be slowly pumped out of the chamber 101, so that the flow of the precursor G101 can be stabilized. Therefore, when the precursor G101 is deposited on the substrate W, the uniformity of the substrate W can be improved.

The first vertical distance d1, d3, d5 is adjustable, and the second vertical distance d2, d4, d6 is not adjustable, wherein the second vertical distance d2, d4, d6 is, for example but not limited to, 0.2-0.8 mm. Specifically, the hollow component 103, 203, 303 and the baffle 1031, 2031, and 3031 can move relatively to adjust the first vertical distance d1, d3, d5, in other words, at least one of the hollow component 103, 203, 303 and the baffle 1031, 2031, and 3031 is movable relative to the other. When the atomic layer deposition equipment 1 is used to perform deposition on the substrate W, the first vertical distance d1, d3, d5 is longer than the second vertical distance d2, d4, d6, so that the upper pumping device can control the flow field of the fluid well in the chamber 101, and therefore the uniformity of the substrate W is better. Preferably, in the case where the ratio of the first vertical distance d1, d3, d5 to the second vertical distance d2, d4, d6 is greater than 1.5, the flow field of the fluid in the chamber 101 can be better controlled, so the uniformity of the substrate W is better in the deposition process. The combination of the baffle and the hollow component is to create the upper and lower exhaust paths P1031 and P1032. If there are any combination of objects that can create the upper and lower exhaust paths P1031, P1032, they all belong to the concept of the present disclosure or extension thereof.

In other embodiments, the baffle 1031, 2031, 3031 may not be connected to the substrate stage 102, 202, 302. Specifically, one end of the baffle 1031, 2031, 3031 can be connected to the hollow component 103, 203, 303 to create the upper and lower exhaust paths P1031, P1032, wherein the first vertical distance d1, d3, d5 is formed between the horizontal extension portion H1031, H2031, H3031 of the baffle 1031, 2031, 3031 and the bottom of the hollow component 103, 203, 303, and the second vertical distance d2, d4, d6 is formed between the horizontal extension portion H1031, H2031, H3031 of the baffle 1031 and the outer portion 1022 of the substrate stage 102, wherein the second vertical distance d2, d4, d6 is shorter than the first vertical distance d1, d3, d5.

Figure 2:
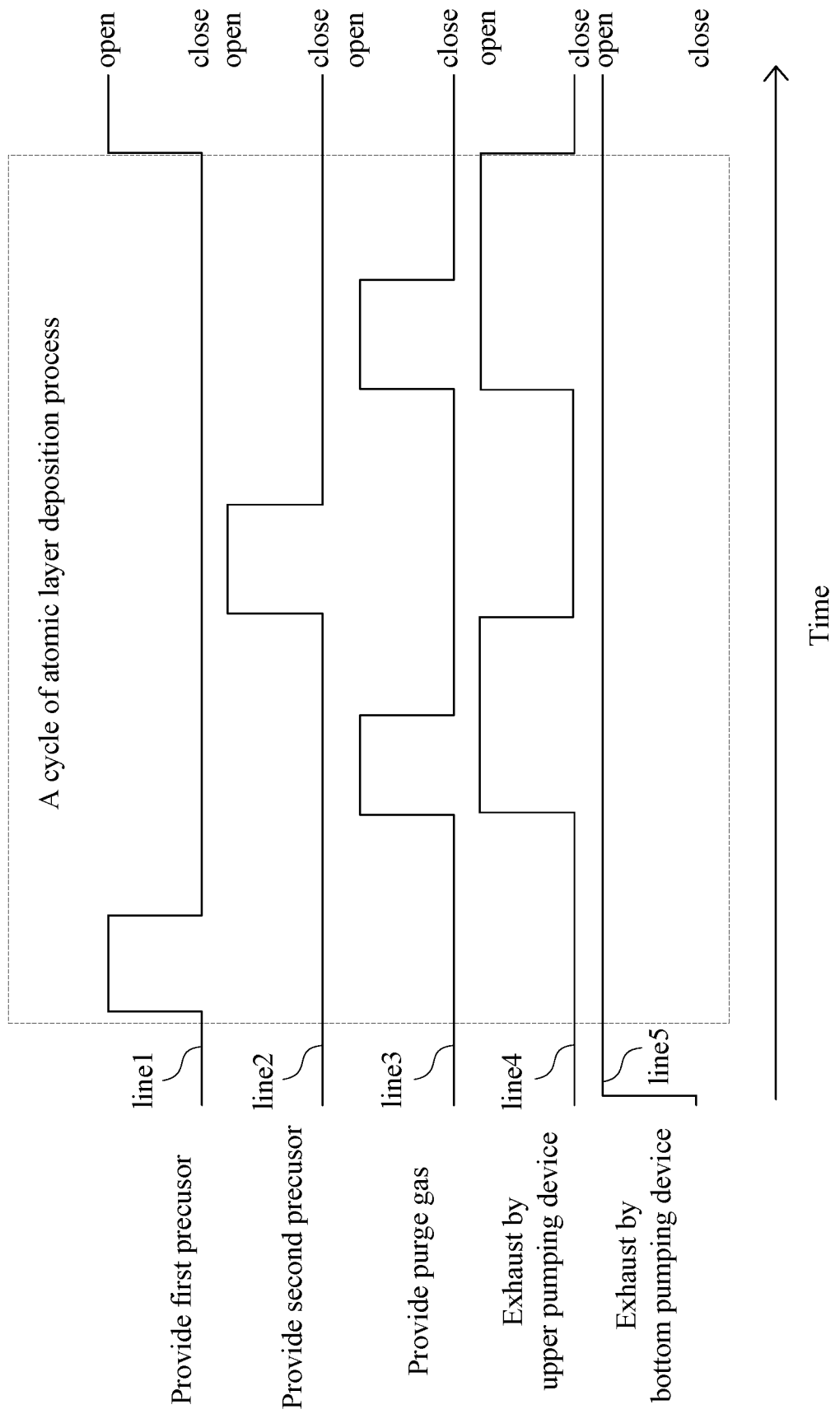
FIG. 2 is a trend chart illustrating steps of an atomic layer deposition process in relation to time according to an embodiment of the present disclosure.

Referring to FIG. 2 and FIG. 1A to realize the method of the atomic layer deposition process. FIG. 2 is a trend chart illustrating steps of an atomic layer deposition process in relation to time according to an embodiment of the present disclosure.

First, referring to line5, after a substrate W is placed on the substrate stage 102, the bottom pumping port O101 of the bottom pumping device is used to pump out a fluid from the containing space S of the chamber 101 and the pumping continues throughout the atomic layer deposition process. This step is one of the steps to control the flow field of the fluid in the chamber 101.

Next, referring to line1, a first precursor G101 is provided to the containing space S of the chamber 101 from the top of the chamber 101 by the shower head assembly 104, and the first precursor G101 diffuses to the substrate W to react and deposit with the material on the surface of the substrate W which is placed on the substrate stage 102.

After the target amount of the first precursor G101 is reached (the target amount is determined according to the process parameters), the shower head assembly 104 stops to provide the first precursor G101 to the containing space S of the chamber 101.

Further, referring to line3 and line4, after stop providing the first precursor G101 to the containing space S of the chamber 101, the purge gas G102 (such as but not limited to nitrogen) is provided from the shower head assembly 104 to the containing space S of the chamber 101 to purge the first precursor G101. At the same time, the upper exhaust path P1031 formed between the hollow component 103 and the baffle 1031 is used to pump out the first precursor G101 from the containing space S of the chamber 101, and this step is one of the steps to control the flow field of the fluid in the chamber 101. Specifically, the flow field of the first precursor G101 is slow and can react with the substrate W in a dynamic manner. During the reaction (deposition), the first precursor G101 and the purge gas G102 are slowly pumped out of the chamber 101.

When the fluid in the chamber 101 flows slowly, its flow field can be stably controlled and turbulence can be avoided. The timing of turning the upper and bottom pumping devices on and off can control the flow field of the fluid and improve the uniformity of the substrate.

Finally, referring to line3 and line4, the purge gas G102 is stopped from being provided to the containing space S of the chamber 101, and the pumping of the precursor G101 from the containing space S of the chamber 101 through the upper exhaust path P1031 is stopped.

In one embodiment, the time of pumping out the precursor G101 from the containing space S of the chamber 101 through the upper exhaust path P1031 is longer than the time of providing purge gas G102, but there is no limitation thereto. The time of pumping out the precursor G101 from the containing space S of the chamber 101 through the upper exhaust path P1031 can be equal to the time of providing purge gas G102.

Further, the step of providing a second precursor is similar to the step of providing the first precursor. Referring to line2, after the purge gas G102 stopped being provided to the chamber 101 for a period of time, and the upper pumping device stopped pumping, a second precursor is provided to the containing space S of the chamber 101 from the top of the chamber 101 by the shower head assembly 104, and the second precursor diffuses to the substrate W to react and deposit with the material on the surface of the substrate W which is placed on the substrate stage 102.

After the target amount of the second precursor is reached (the target amount is determined according to the process parameters), the shower head assembly 104 stops providing the second precursor to the containing space S of the chamber 101.

Further, referring to line3 and line4, after stop providing the second precursor to the containing space S of the chamber 101, the purge gas is provided from the shower head assembly 104 to the containing space S of the chamber 101 to purge the second precursor. At the same time, the upper exhaust path P1031 formed between the hollow component 103 and the baffle 1031 is used to pump out the second precursor from the containing space S of the chamber 101 to control the flow field of the second precursor and the purge gas.

Finally, the providing of the purge gas to the containing space S of the chamber 101 is stopped, and the pumping of the second precursor from the containing space S of the chamber 101 through the upper exhaust path P1031 is stopped. It is to be noted that the fluid pumped out from the containing space S of the chamber 101 through the upper exhaust path P1031 could be different throughout the atomic layer deposition process in regards to different stages of the process, wherein the fluid could be air, purged gas, precursor, or prior to the beginning of the process, any substances remaining in the containing space S of the chamber 101.

In one embodiment, the time of pumping out the precursor from the containing space S of the chamber 101 through the upper exhaust path P1031 is longer than the time of providing purge gas, but there is no limitation thereto. The time of pumping out the precursor from the containing space S of the chamber 101 through the upper exhaust path P1031 can be equal to the time of providing purge gas. After the first precursor and the second precursor are deposited on the substrate W, one cycle of the atomic layer deposition process is completed, and the steps of each subsequent cycle are the same as the above.

Figure 3:
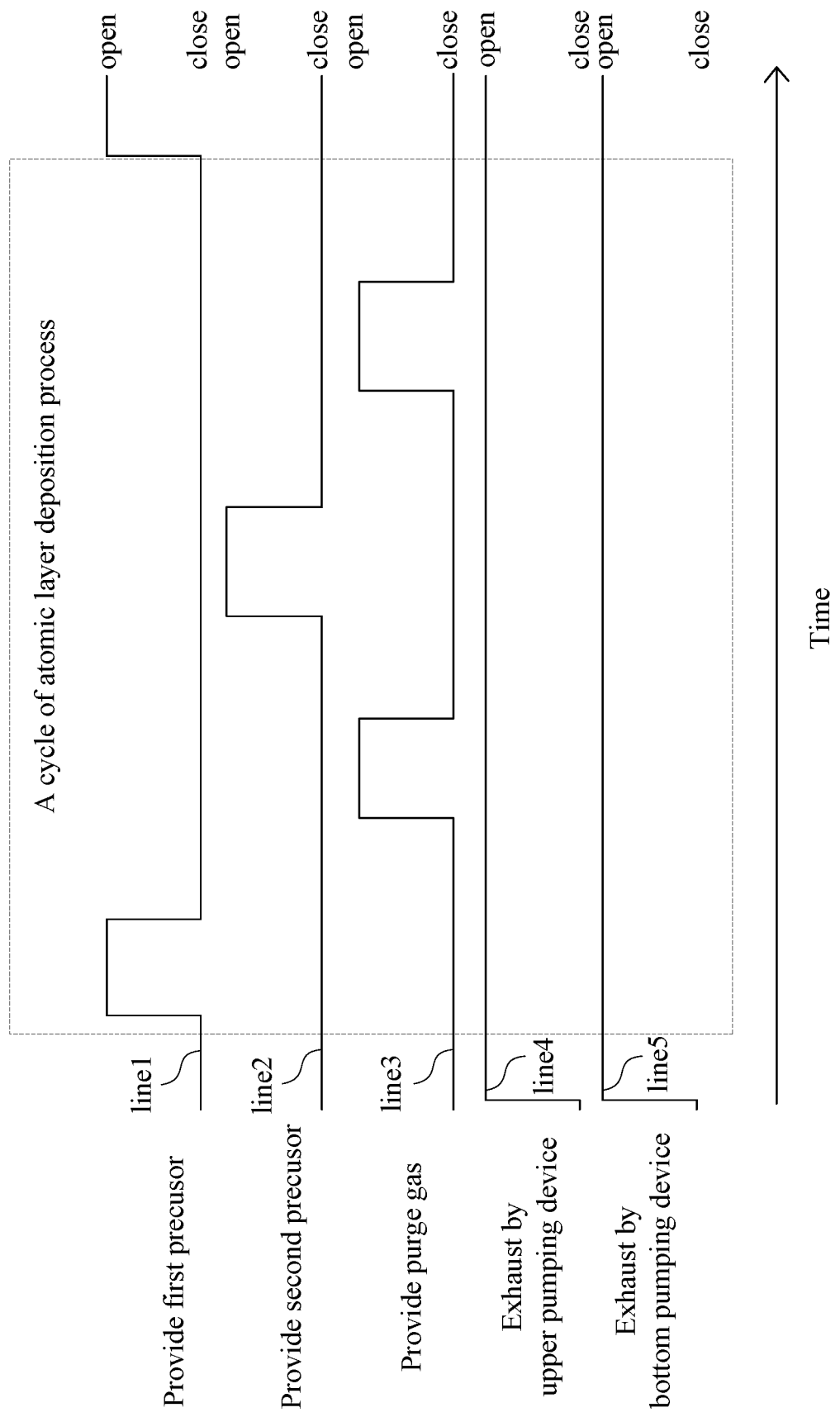
FIG. 3 is a trend chart illustrating steps of an atomic layer deposition process in relation to time according to another embodiment of the present disclosure.

Referring to FIG. 3 to realize another method of the atomic layer deposition process. FIG. 3 is a trend chart illustrating steps of an atomic layer deposition process in relation to time according to another embodiment of the present disclosure.

First, referring to line5 and line4, after the substrate W is placed on the substrate stage 102, the bottom pumping port O101 of the bottom pumping device is used to pump out a fluid from the containing space S of the chamber 101 and the pumping continues throughout the atomic layer deposition process, and the upper exhaust path P1031 formed between the hollow component 103 and the baffle 1031 is used to pump out the fluid from the containing space S of the chamber 101, wherein pumping out the fluid from the containing space S of the chamber 101 through the upper exhaust path P1031 is continuous throughout the atomic layer deposition process.

Next, referring to line1, the first precursor G101 is provided to the containing space S of the chamber 101 from the top of the chamber 101 by the shower head assembly 104, and the first precursor G101 diffuses to the substrate W to react and deposit with the material on the surface of the substrate W which is placed on the substrate stage 102. After the target amount of the first precursor G101 is reached (the target amount is determined according to the process parameters), the shower head assembly 104 stops providing the first precursor G101 to the containing space S of the chamber 101. Further, referring to line3, after stop providing the first precursor G101 to the containing space S of the chamber 101, the purge gas G102 (such as but not limited to nitrogen) is provided from the shower head assembly 104 to the containing space S of the chamber 101 to purge the first precursor G101.

Finally, the providing of the purge gas G102 to the containing space S of the chamber 101 is stopped, and the pumping of the precursor G101 from the containing space S of the chamber 101 through the upper exhaust path P1031 continues.

The step of providing the second precursor is similar to the step of providing the first precursor. After the first precursor and the second precursor are deposited on the substrate W, one cycle of the atomic layer deposition process is completed, and the steps of each subsequent cycle are the same as the above.

The effects of the atomic layer deposition equipment 1 and the process method using the same are shown in Table 1. Table 1 shows the wafer thickness of a 12-inch silicon wafer after the atomic layer deposition process. The thickness uniformity of the wafer is 0.34686, which is a good result after deposition.

TABLE 1

| Substrate: 12-inch silicon wafer | |
| --- | --- |
| thickness of wafer center | 19.80 nm |
| thickness of wafer right side | 19.81 nm |
| thickness of wafer left side | 19.97 nm |
| thickness of wafer bottom | 19.89 nm |
| thickness of wafer top | 19.88 nm |
| average thickness of wafer | 19.87 nm |
| Uniformity (U %) | 0.34686 |

In conclusion, the technical benefits of the atomic layer deposition equipment and process method of the present disclosure are described in the following.

In the conventional technology, in the atomic layer deposition process, a large amount of precursors are usually introduced into a large chamber to react with a substrate. Due to the large number of precursors being used, the cost is high. One way to save cost is to reduce the volume of the chamber to reduce the amount of the precursors, but this method often causes the precursors to form turbulence in the chamber, resulting in poor uniformity of the substrate after deposition. The present disclosure provides an atomic layer deposition equipment and an atomic layer deposition process method that do not need to use a large chamber, and can form a stable, slow and uniform flow field of the precursor by using the upper pumping device to optimize the uniformity of the substrate after deposition. Furthermore, the precursors that have not reacted with the substrate can be attached to the baffle, so that the baffle can be directly replaced when the equipment is being cleaned, instead of replacing the substrate stage, and thus saving costs.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. An atomic layer deposition equipment, comprising:
   a chamber comprising a containing space;
   a substrate stage disposed in the containing space of the chamber for supporting at least one substrate;
   at least one bottom pumping port fluidly connected to the containing space of the chamber and connected to a pump, for exhausting at least one fluid in the containing space;
   at least one hollow component comprising at least one exhaust hole and fluidly connected to the containing space of the chamber, wherein the hollow component is disposed next to the substrate stage;
   a baffle disposed below the hollow component and forming a upper exhaust path with the hollow component, and
   a shower head assembly fluidly connected to the containing space of the chamber, for providing at least one precursor or a purge gas into the chamber.

2. The atomic layer deposition equipment of claim 1, wherein the baffle further comprises at least one horizontal extension portion and at least one vertical extension portion, the vertical extension portion is connected to the horizontal extension portion, and the horizontal extension portion is connected to the substrate stage.

3. The atomic layer deposition equipment of claim 2, wherein the horizontal extension portion of the baffle is connected to an edge of the substrate stage.

4. The atomic layer deposition equipment of claim 2, wherein the horizontal extension portion of the baffle is connected to atop of the substrate stage, and the substrate stage holds the substrate through the baffle.

5. The atomic layer deposition equipment of claim 1, wherein the baffle further comprises at least one horizontal extension portion and at least one vertical extension portion, the vertical extension portion is connected to the horizontal extension portion, the exhaust hole is located at a bottom of the hollow component, and one end of the vertical extension portion corresponds to the exhaust hole of the hollow component.

6. The atomic layer deposition equipment of claim 5, wherein the substrate stage comprises a substrate supporting portion and an outer portion, the substrate supporting portion is connected to the outer portion, the cross-sectional area of the outer portion is larger than the cross-sectional area of the substrate supporting portion, there is a first vertical distance between the horizontal extension portion of the baffle and the bottom of the hollow component, and there is a second vertical distance between the horizontal extension portion and the outer portion of the substrate stage, wherein the second vertical distance is shorter than the first vertical distance.

7. The atomic layer deposition equipment of claim 6, wherein at least one of the hollow component and the baffle is movable relative to the other for adjusting the first vertical distance.

8. The atomic layer deposition equipment of claim 1, wherein the baffle further comprises at least one horizontal extension portion and at least one vertical extension portion, the vertical extension portion is connected to the horizontal extension portion, the exhaust hole is located at a side of the hollow component, and one end of the horizontal extension portion corresponds to the exhaust hole of the hollow component.

9. The atomic layer deposition equipment of claim 8, wherein the substrate stage comprises a substrate supporting portion and an outer portion, the substrate supporting portion is connected to the outer portion, the cross-sectional area of the outer portion is larger than the cross-sectional area of the substrate supporting portion, there is a first vertical distance between the horizontal extension portion of the baffle and the bottom of the hollow component, and there is a second vertical distance between the horizontal extension portion and the outer portion of the substrate stage, wherein the second vertical distance is shorter than the first vertical distance.

10. The atomic layer deposition equipment of claim 9, wherein at least one of the hollow component and the baffle is movable relative to the other for adjusting the first vertical distance.

11. The atomic layer deposition equipment of claim 1, wherein one end of the baffle is connected to the hollow component.

12. The atomic layer deposition equipment of claim 11, wherein the substrate stage comprises a substrate supporting portion and an outer portion, the substrate supporting portion is connected to the outer portion, the cross-sectional area of the outer portion is larger than the cross-sectional area of the substrate supporting portion, there is a first vertical distance between the horizontal extension portion of the baffle and the bottom of the hollow component, and there is a second vertical distance between the horizontal extension portion and the outer portion of the substrate stage, wherein the second vertical distance is shorter than the first vertical distance.

13. The atomic layer deposition equipment of claim 1, wherein the position of the hollow component is higher than the substrate stage.

14. An atomic layer deposition process method of applying an atomic layer deposition equipment of claim 1, the method comprising:
  pumping out a fluid from the containing space of the chamber through the bottom pumping port;
  providing a precursor to the containing space of the chamber for the precursor to react with the substrate on the substrate stage;
  stopping providing the precursor to the containing space of the chamber;
  providing a purge gas to the containing space of the chamber, and pumping out the precursor from the containing space of the chamber through the upper exhaust path formed between the hollow component and the baffle; and
  stopping providing the purge gas to the containing space of the chamber, and stopping pumping out the precursor from the containing space of the chamber through the upper exhaust path.

15. The atomic layer deposition process method of claim 14, wherein the baffle of the atomic layer deposition equipment comprises at least one horizontal extension portion, and at least one of the hollow component and the baffle moves relatively to the other to adjust a first vertical distance between the horizontal extension portion and a bottom of the hollow component.

16. An atomic layer deposition process method of applying an atomic layer deposition equipment of claim 1, the method comprising:
  pumping out a fluid from the containing space of the chamber through the bottom pumping port, and pumping out the fluid from the containing space of the chamber through the upper exhaust path formed between the hollow component and the baffle, wherein pumping out the fluid from the containing space of the chamber through the upper exhaust path is continuous during the atomic layer deposition process;
  providing a precursor to the containing space of the chamber for the precursor to react with the substrate on the substrate stage;
  stopping providing the precursor to the containing space of the chamber;
  providing a purge gas to the containing space of the chamber; and
  stopping providing the purge gas to the containing space of the chamber, and continuing pumping out the precursor from the containing space of the chamber through the upper exhaust path.

17. The atomic layer deposition process method of claim 16, wherein the baffle of the atomic layer deposition equipment comprises at least one horizontal extension portion, and at least one of the hollow component and the baffle moves relatively to the other to adjust a first vertical distance between the horizontal extension portion and a bottom of the hollow component.

* * * * *